(12) United States Patent
Wang et al.

(10) Patent No.: US 12,306,227 B2
(45) Date of Patent: May 20, 2025

(54) ELECTRICITY METER AND METHOD FOR MANUFACTURING AN ELECTRICITY METER

(71) Applicant: Accuenergy (Canada) Inc., Toronto (CA)

(72) Inventors: Yufan Wang, Toronto (CA); Ketao Li, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 119 days.

(21) Appl. No.: 18/216,590

(22) Filed: Jun. 30, 2023

(65) Prior Publication Data
US 2025/0004023 A1    Jan. 2, 2025

(51) Int. Cl.
G01R 22/06    (2006.01)
H05K 5/02    (2006.01)

(52) U.S. Cl.
CPC ......... *G01R 22/065* (2013.01); *G01R 22/066* (2013.01); *H05K 5/0252* (2013.01)

(58) Field of Classification Search
CPC .......... G01R 22/06; G01R 22/061–068; H05K 5/02; H05K 5/0252
See application file for complete search history.

(56) References Cited

U.S. PATENT DOCUMENTS 5,196,783 A * 3/1993 Howell .................. G01R 1/04
324/156
11,462,816 B2    10/2022 Donkle et al.
2002/0180421 A1* 12/2002 Germer ................ G01R 22/065
324/157
2004/0066311 A1*  4/2004 Giles ........................ H04Q 9/02
340/870.02
2004/0066609 A1*  4/2004 Loy ....................... G01R 22/065
361/664
2005/0270016 A1* 12/2005 Karanam ............... G01R 22/10
324/157

(Continued)

FOREIGN PATENT DOCUMENTS

CN    209822153 U  * 12/2019

OTHER PUBLICATIONS

What Are Utility Meter Tags?, Metal Marker Manufacturing, https://www.metalmarkermfg.com/blog/what-are-utility-meter-tags/.

(Continued)

*Primary Examiner* — Huy Q Phan
*Assistant Examiner* — David B Frederiksen
(74) *Attorney, Agent, or Firm* — Dhiraj Jindal; PATENT YOGI LLC

(57) ABSTRACT

The present invention relates to an electricity meter with a unique structure to prevent tampering and damage to the nameplate. The meter comprises a drawer-like structure with an opening, a nameplate positioned within the drawer-like structure, and a cover fixed to the drawer-like structure over the opening. The cover is designed to protect the nameplate from any external factors that could potentially damage or tamper with it. This innovative design ensures the accuracy and reliability of the electricity meter, preventing any interference with the nameplate. The design can be adapted to various types of electricity meters, making it an essential feature for maintaining the integrity of the meter.

1 Claim, 7 Drawing Sheets

(56) References Cited

U.S. PATENT DOCUMENTS

| | | | |
|---|---|---|---|
| 2006/0043961 A1* | 3/2006 | Loy | G01R 22/065 |
| | | | 324/142 |
| 2012/0249339 A1* | 10/2012 | Hanley | G06Q 50/06 |
| | | | 340/870.02 |
| 2024/0377226 A1* | 11/2024 | Nelson | G09F 3/10 |

OTHER PUBLICATIONS

Meter Nameplate Information, https://www.meuw.org/files/Electric%20Meter%20Nameplate%20information.pdf.

* cited by examiner

ELECTRICITY METER AND METHOD FOR MANUFACTURING AN ELECTRICITY METER

FIELD OF THE INVENTION

The present invention generally relates to electrical devices, more specifically, to an electricity meter. The invention also relates to a method for manufacturing such an electricity meter.

BACKGROUND OF THE INVENTION

Electricity meters play a vital role in measuring the energy consumed by households and businesses in the energy grid. To maintain the accuracy and reliability of these meters, trade measurement regulators have established specifications for the approval of their type. For instance, Measurement Canada requires that each meter must have a nameplate that displays essential information, such as the manufacturer's name, serial number, department approval number, rated frequency, and rated voltage, etc. This information must be indelibly and distinctly marked on the nameplate, which must be attached in a visible location.

The conventional method of creating the nameplate involves using a laser engraving machine or silk-screening. However, these approaches have certain limitations. For instance, energy meters come in different sub-models, each with specific key information. This means that the production process for different sub-models is complex and requires different content to be engraved or silk-screened. Moreover, the engraved text can be polished off with sandpaper, while tampering with the engraved text is a significant concern.

Thus, there is a need for further improvements to electricity meters.

SUMMARY OF THE INVENTION

The embodiments of the present disclosure generally related to a bushing current transformer.

In some embodiments, the electricity meter includes a drawer-like structure with a nameplate positioned inside and a cover fixed over the opening to protect the nameplate from tampering or damage. The unique design of the meter ensures the accuracy and reliability of the meter readings by preventing any interference with the nameplate.

In some embodiments, the method for manufacturing the electricity meter involves printing essential information on nameplates, identifying the corresponding nameplate for each sub-model of the meter, fixing the nameplate in the drawer-like structure of the meter, and attaching a cover using a fastener that passes through a cylindrical hole in the drawer-like structure and a hollow cylindrical protrusion in the cover. This process ensures the correct identification and installation of the nameplate, and the secure attachment of the cover.

These and other features and aspects of the present disclosure will become fully apparent from the following detailed description of exemplary embodiments, the appended claims and the accompanying drawings.

DETAIL DESCRIPTIONS OF THE INVENTION

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

Figure 1:
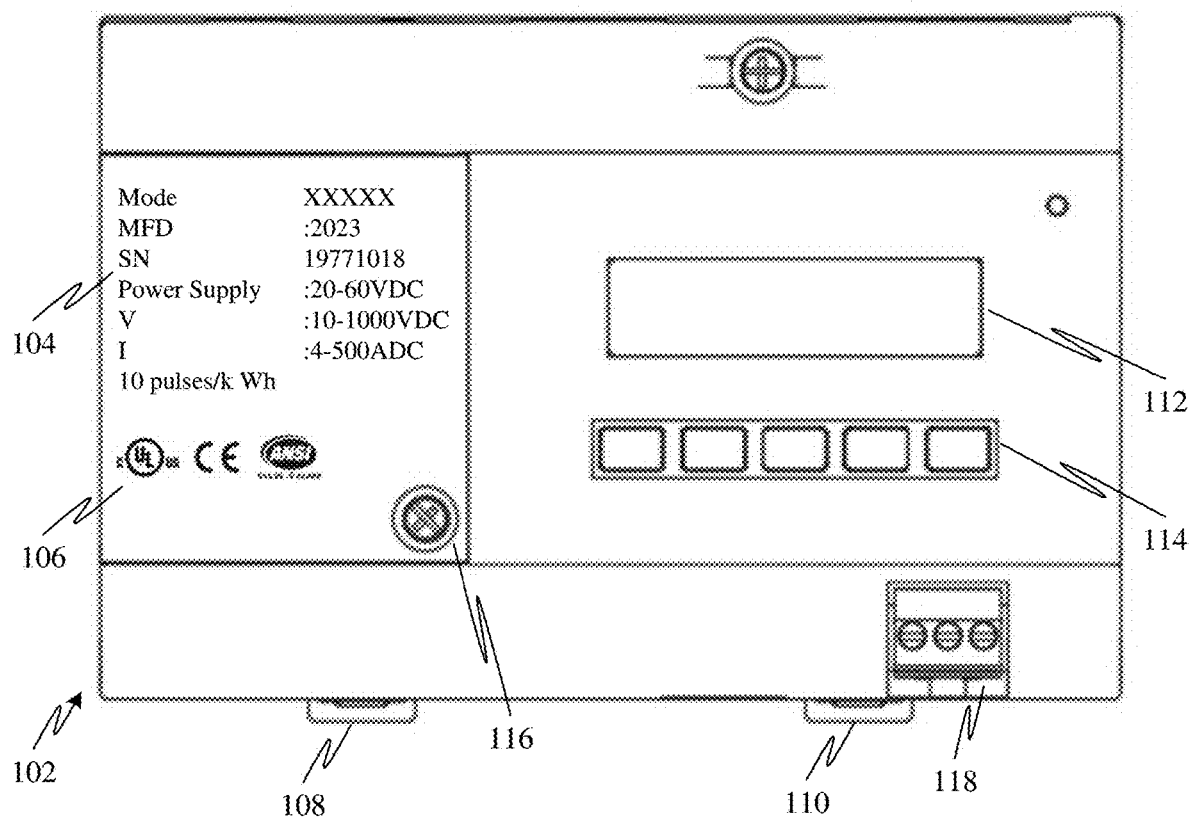
FIG. 1 is a front view of an electricity meter according to some embodiments of the present invention.

FIG. 1 depicts a front view of an electricity meter 102, which incorporates several features that enhance its accuracy, durability, and security. The meter 102 includes a nameplate 106 that displays essential information, such as the manufacturer's name, serial number, department approval number, rated frequency, and rated voltage, etc. The nameplate 106 is protected by a clear cover 104, which serves to prevent wear and tear and tampering with the information. The cover 104 is made from materials such as polycarbonate or acrylic and can be affixed to the meter 100 using various methods, including adhesives or mechanical fasteners such as fastener 116.

In addition to protecting the nameplate 106, the cover 104 enhances the security of the meter 102 by using a fastener 116 to attach it to the designated holes. The fastener 116 can be made from materials such as stainless steel or brass and can be tightened using various tools such as screwdrivers or pliers. This feature ensures that the cover 104 remains firmly attached to the meter 102, even in harsh environmental conditions.

To further improve the usability and functionality of the meter 102, it includes two clips 108 and 110 that enable it to be fixed to a DIN rail. This feature makes it easier to install and remove the meter 102 when necessary. Additionally, the meter 102 includes a display 112 that shows measurement data, such as current, voltage, and energy, making it easier for users to monitor their energy consumption. The meter 102 also features 5 function buttons 114, which allow the user to operate it efficiently. Finally, the meter 102 includes a terminal 118 that provides connections with external devices, making it possible to integrate it into larger energy management systems.

Figure 2:
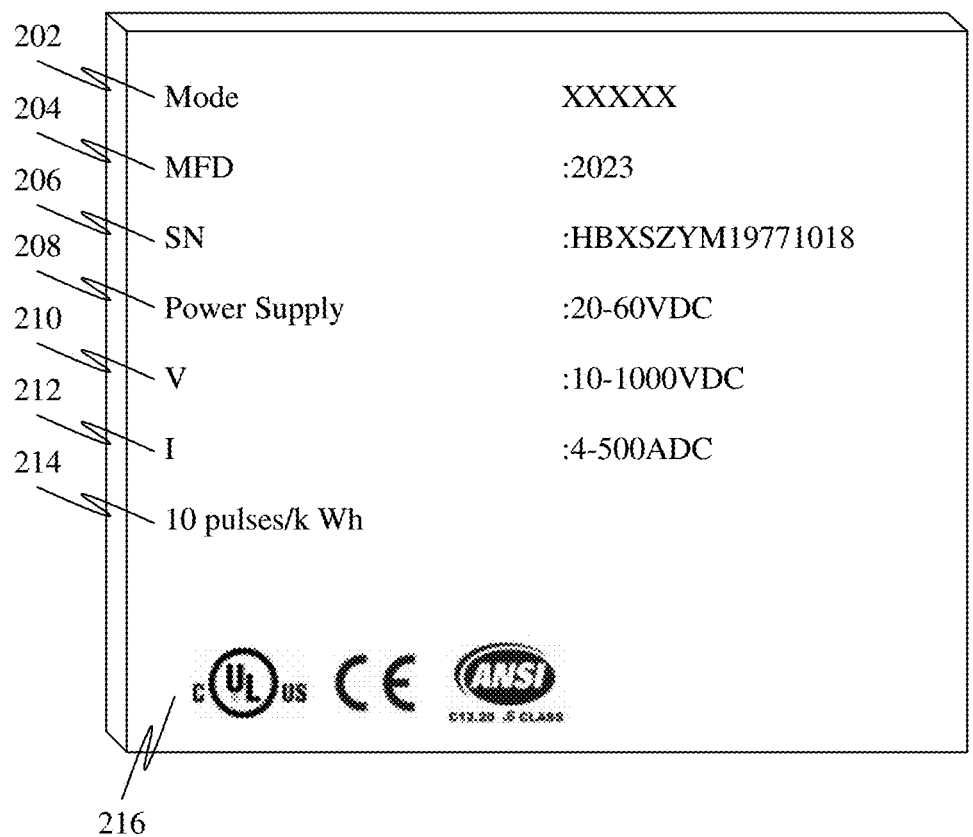
FIG. 2 is a schematic diagram of a nameplate according to some embodiments of the present invention.

FIG. 2 illustrates the nameplate 106 of the electricity meter 102 according to some embodiments of the present invention.

The nameplate 106 can be created from a variety of materials, including plastic, metal, or paper, and the necessary information can be printed or engraved onto it using various technologies such as inkjet, screen printing, or laser printing. This allows for greater flexibility in the manufacturing process, as different sub-models can be labeled differently with ease. The model number of the meter 102 is described in Model 202, while MFD 204 indicates the manufacturing date of the meter. SN 206 is the serial number assigned to the meter 102 for identification purposes. The power supply 208 denotes the input voltage range required to power the meter 102. The voltage range measured by the meter 102 is defined by V 210, while the current range measured is defined by I 210. Pulse number 214 provides information on how many pulses will be generated per kWh by the meter 102. Finally, symbol 216 denotes the certificates that have been approved for the meter 102.

In addition to the information displayed on the nameplate 106, the present invention provides further security features to prevent tampering and fraud. For example, the nameplate 106 may have an anti-tampering feature, such as a hologram or a hidden security code that can only be viewed with a special tool. This provides an additional layer of security to ensure that the meter 102 has not been tampered with. Furthermore, the nameplate 106 may be designed to be easily replaceable, allowing for damaged or worn nameplates to be easily replaced without the need for a whole new meter.

To facilitate easy installation and maintenance, the present invention also provides for the nameplate 106 to be easily accessible. For example, the cover 104 may be designed to be easily removed, allowing for quick access to the nameplate 106 for inspection or replacement. Additionally, the nameplate 106 may be designed to be easily readable from various angles and lighting conditions to ensure that the information can be easily and accurately read by technicians and regulators.

Figure 3:
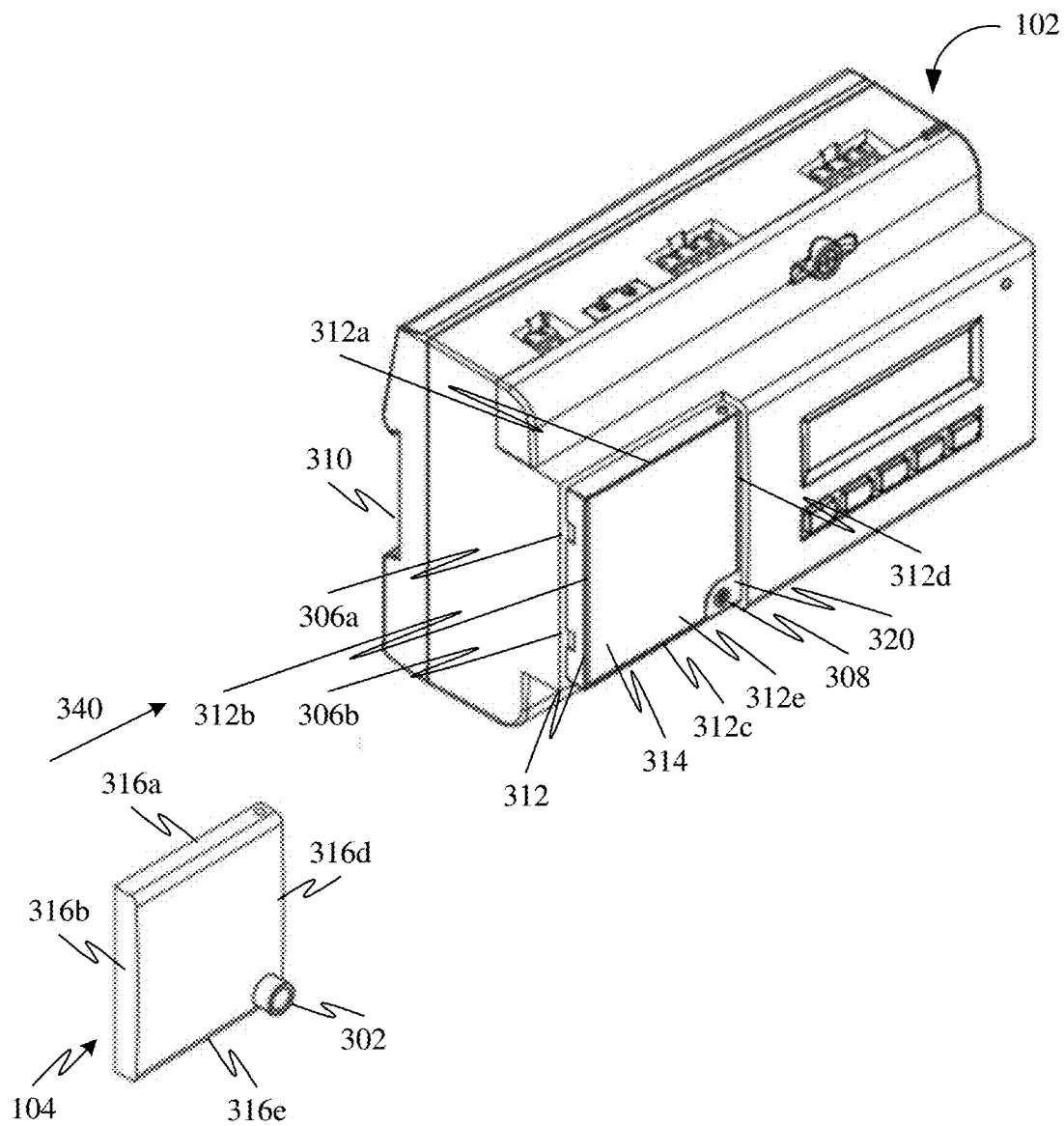
FIG. 3 is a schematic diagram of installing the cover onto the electricity meter according to some embodiments of the present invention.

FIG. 3 demonstrates the process of installing the cover 304 onto the electricity meter 102, as shown in some embodiments of the present invention. The meter 102 includes a drawer-like structure 314 on its front, which can be integrated with other parts of the meter 102 in some embodiments. The structure 314 comprises a base panel 312e, a front panel 312b, a back panel 312d, and two side panels 312a and 312c that create space to accommodate the nameplate 106. The nameplate 106 can be fixed on the surface of the base panel 312e. To attach the cover 304, two apertures 306a and 306b are present on the front panel 312b. In the lower right corner of structure 314, a protrusion structure 320 with a cylindrical hole 308 is present. The protrusion structure 320 can be integrated with the structure 314. In addition, the meter 102 can be installed on a DIN rail through a concave structure 310.

Figure 4:
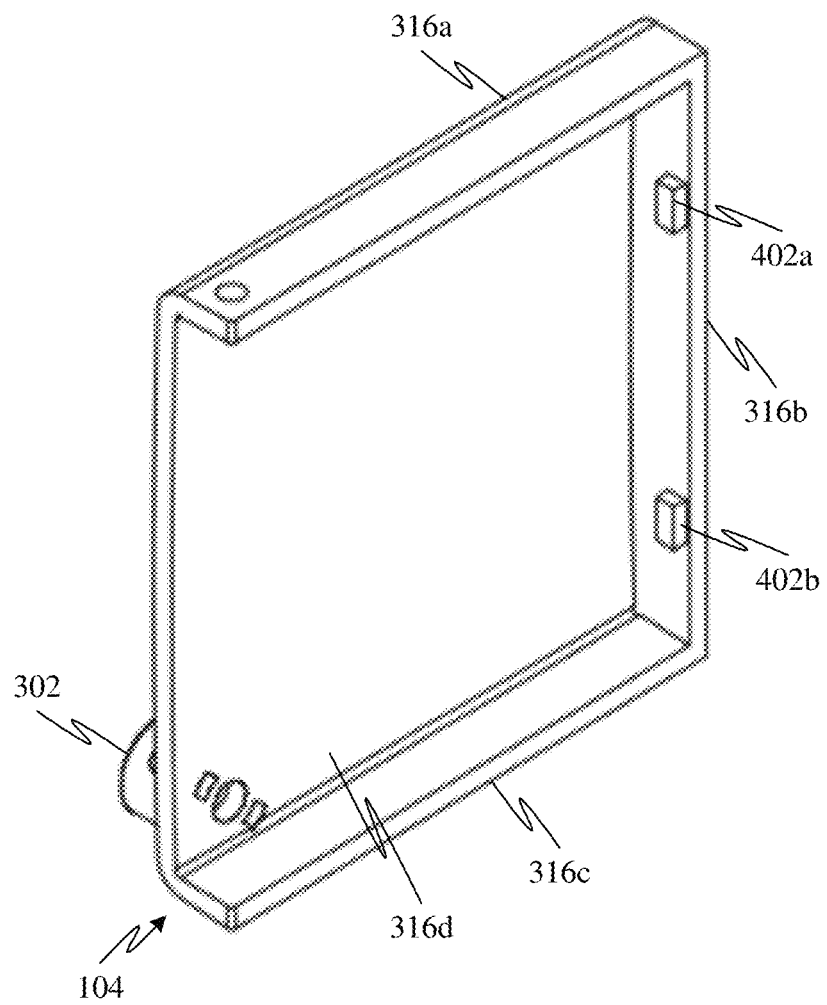
FIG. 4 is a rear view of the cover according to some embodiments of the present invention.

The cover 104 is a container-like structure made of rigid plastic material, designed to protect the nameplate 106 on the base plate 312e. It comprises a base panel 316d, a front panel 316b, and two side panels 316a and 316c that enclose the space to protect the underlying nameplate 106. A hollow cylindrical protrusion 302 is present on the lower right side of the cover 304. Two protrusions 402a and 402b are on the inner surface of the front panel 316b (shown in FIG. 4).

The cover 304 can be installed on the structure 314 in the direction indicated by the arrow 340. After the installation, the protrusions 402a and 402b of the cover 304 are inserted into apertures 306a and 306b, respectively, to prevent it from moving outward. After the installation, panel 316a engages with panel 312a, panel 316b engages with panel 312b, and panel 316c engages with panel 312c. The cover 304 completely covers the exterior of structure 314, and the hollow cylindrical protrusion 302 and the cylindrical hole 308 become concentric after the installation. This design enhances the security of the meter 102 by protecting the nameplate 106 from wear and tear and prevents tampering with the information.

Figure 5:
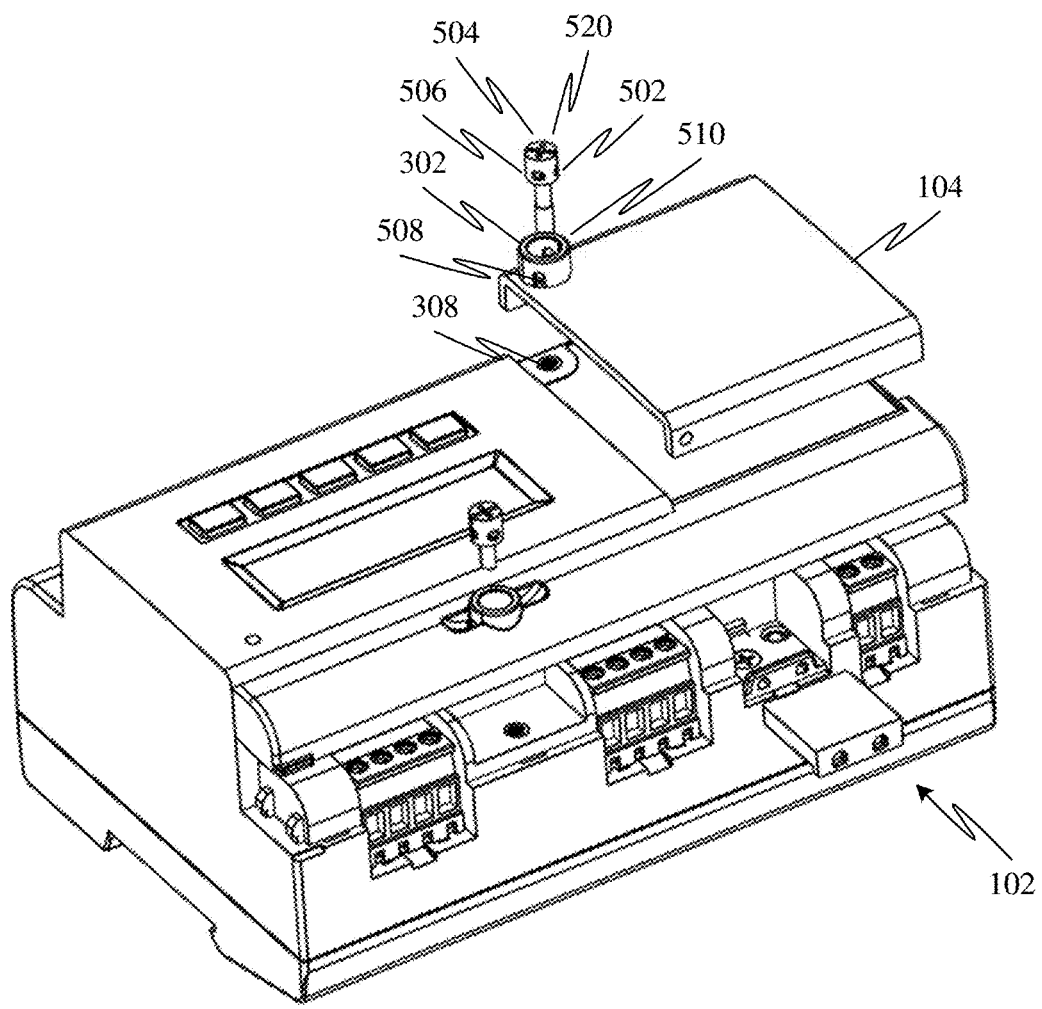
FIG. 5 is schematic diagram of fixing the cover on the electricity meter using a fastener according to some embodiments of the present invention.

FIG. 5 depicts a fastener 502 that is used to securely fix the cover 104 onto the electricity meter 102. The meter 102 is illustrated from the top, front, and right angles in this figure. The fastener 502 has a head 504 with an aperture 506 on the side, and it allows wire of a meter seal to run through. In some embodiments, there is a cross-shaped groove 520 on the top of the fastener 502, which can be used to insert a tool, such as a screwdriver, to turn the fastener 502 to secure or release the cover 104. The protrusion 302 has an aperture 508 on its side that faces another aperture 510 located on the protrusion's end. The fastener 502 can be screwed into the cylindrical hole 308 through the hollow cylindrical protrusion 302 using a male thread located on the bottom part of the fastener 502. The thread will match the female thread of the cylindrical hole 308 in some embodiments. This fastening mechanism provides a secure and tamper-proof solution for attaching the cover 104 onto the meter 102, ensuring the safety and integrity of the meter's components.

In some embodiments of the present invention, the fastener 502 is made of a durable and corrosion-resistant material such as stainless steel or aluminum to ensure long-term security of the electricity meter 102. The head 504 of the fastener 502 is designed with a unique shape or pattern to prevent unauthorized removal or tampering. The aperture 506 through the side of the head 504 can be used for locking or sealing the fastener 502 with a security seal or lock to provide an extra layer of security. In some embodiments, the male thread on the bottom part of the fastener 502 can be designed with a tamper-resistant shape or coating to prevent unauthorized access. Additionally, the fastener 502 can be color-coded or labeled with unique identifiers to aid in identification and tracking.

Figure 6:
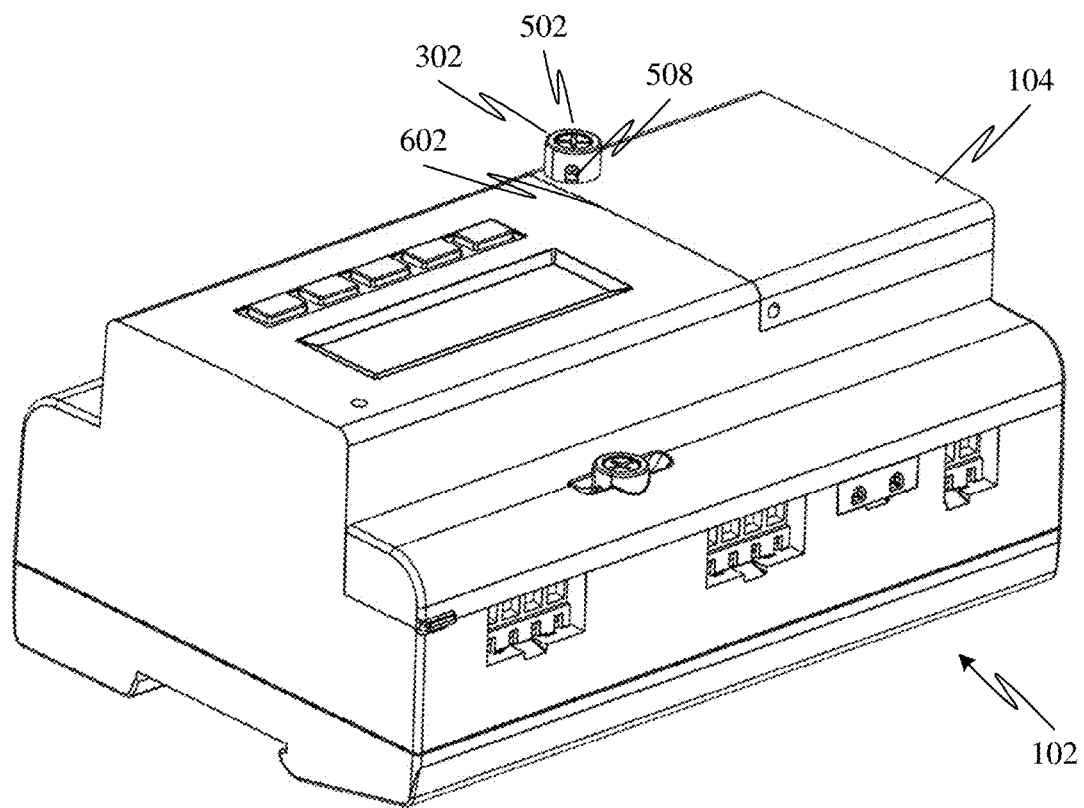
FIG. 6 is front, top, right perspective view of the electricity meter according to some embodiments of the present invention.
Figure 7:
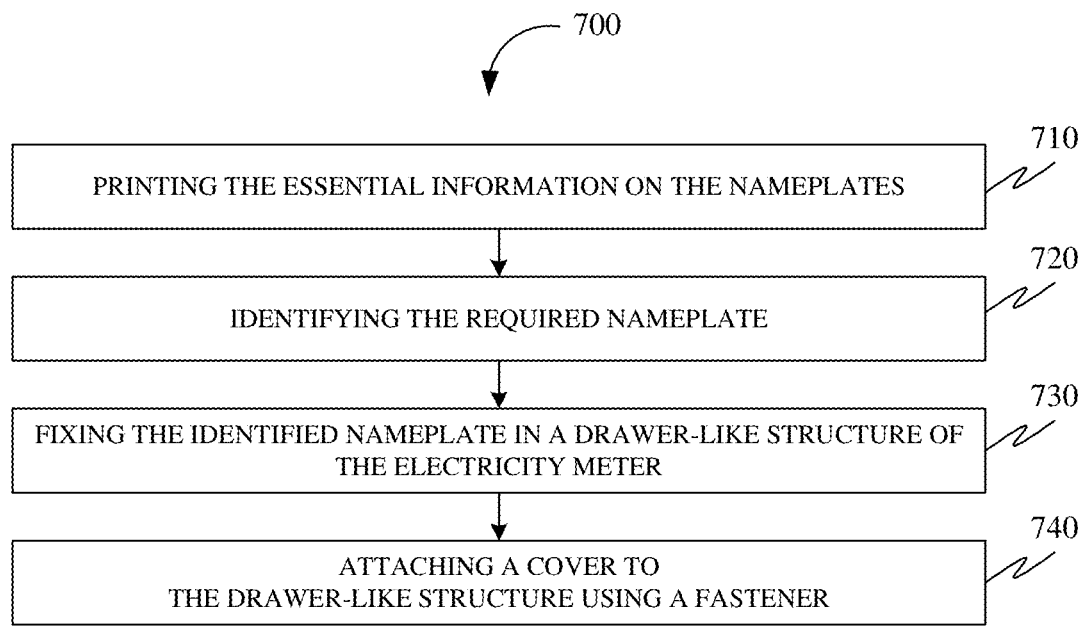
FIG. 7 is flowchart of manufacturing the energy meter according to some embodiments of the present invention.

FIG. 6 provides a perspective view of the electricity meter 102 in accordance with some embodiments of the present invention. As shown in FIG. 3, the fastener 502 is securely installed in the hollow cylindrical protrusion 302, and as a result, a hole 602 is formed that runs through the aperture 508, aperture 506, and aperture 510. In some embodiments, a meter seal may be positioned through the hole 602 and placed on top of the fastener 502, thereby effectively preventing unauthorized access to the nameplate 106 via the cover 104.

The invention also relates to a method for manufacturing an electricity meter 102 such as that described previously. The method begins with step 710 printing essential information associated with the sub-model of the electricity meter on nameplates. The essential information may be the required specifications required by trade measurement regulators such as the manufacturer's name, serial number, department approval number, rated frequency. A new electricity may consist of many sub-models. The basic functions of each sub-model are consistent, but they have slightly different optional software or hardware features. The essential information may be different for the different sub-models.

Once the nameplates are printed, the manufacturer identifies the corresponding nameplate according to the sub-model of the meter being manufactured 720. The identified nameplate is then fixed in a drawer-like structure of the electricity meter 730. The drawer-like structure is designed to securely hold the nameplate.

After the nameplate is fixed in the drawer-like structure, a cover is attached using a fastener that passes through a cylindrical hole in the drawer-like structure and a hollow cylindrical protrusion in the cover 740. The cover is designed to protect the nameplate of the electricity meter and ensure that it is tamper-proof.

Overall, this method provides a highly efficient and accurate way to manufacture electricity meters that are tailored to different sub-models. By accurately printing essential information on the nameplates and securely attaching them to the drawer-like structure, this method ensures that each electricity meter is manufactured with precision and attention to detail.

What is claimed is:

1. An electricity meter, comprising:
    a drawer-like structure having an opening, the drawer-like structure comprising a base panel configured to support a nameplate, a front panel, a back panel, and two side panels forming an enclosure to receive the nameplate; at least two apertures positioned on the front panel; and a protrusion structure located on a lower right corner of the drawer-like structure, the protrusion structure comprising a cylindrical hole, wherein the drawer-like structure is configured to allow secure placement and replacement of the nameplate corresponding to different sub-models of the electricity meter;
    the nameplate positioned within the drawer-like structure, the nameplate comprising printed or engraved essential information specific to the sub-model of the electricity meter, wherein the nameplate further comprises an anti-tampering security feature comprising at least one of a holographic security mark or a hidden security code visible only under specific conditions;
    a cover fixed to the drawer-like structure over the opening to protect the nameplate from damage or tampering, the cover comprising a base panel, a front panel, and two side panels configured to enclose and shield the nameplate within the drawer-like structure; at least two protrusions disposed on an inner surface of the front panel of the cover, the at least two protrusions being configured to be inserted into the at least two apertures of the drawer-like structure to secure the cover in place; and a hollow cylindrical protrusion positioned on a lower right side of the cover, the hollow cylindrical protrusion aligns concentrically with the cylindrical hole of the protrusion structure upon installation, wherein the cover is made of rigid plastic material; and
    a fastening mechanism comprising a fastener configured to be inserted through the hollow cylindrical protrusion and threaded into the cylindrical hole of the protrusion structure, the fastener comprising a head with an aperture for receiving a meter seal, wherein the meter seal provides a visual and physical indication of unauthorized access.

* * * * *